United States Patent [19]

Lunderius et al.

[11] Patent Number: 4,785,406

[45] Date of Patent: Nov. 15, 1988

[54] QUAD EXCHANGE POWER CONTROLLER

[75] Inventors: Erik Lunderius, San Jose; Simon Szeto, South San Francisco, both of Calif.; Jan Johansson, Balsta, Sweden

[73] Assignee: Advanced Micro Devices, Inc., Sunnyvale, Calif.

[21] Appl. No.: 908,475

[22] Filed: Sep. 17, 1986

[51] Int. Cl.$^4$ .................. G06F 15/20; G05F 1/46
[52] U.S. Cl. .................. 364/483; 364/492; 307/125; 307/126; 323/241; 323/283
[58] Field of Search .................. 363/19, 21; 323/234, 323/283, 241; 361/92; 307/130, 125, 126, 131; 364/483, 492

[56] References Cited

U.S. PATENT DOCUMENTS

| | | | |
|---|---|---|---|
| 4,308,492 | 12/1981 | Mori et al. | 364/480 |
| 4,516,214 | 5/1985 | Ray | 364/483 |
| 4,538,231 | 8/1985 | Abe et al. | 364/483 |
| 4,593,180 | 6/1986 | Narita et al. | 361/92 |
| 4,623,967 | 11/1986 | Naimer | 364/483 |

Primary Examiner—Parshotam S. Lall
Assistant Examiner—Ellis B. Ramirez
Attorney, Agent, or Firm—Davis Chin

[57] ABSTRACT

A power controller for supplying separately a regulated power source to a plurality of "S" lines and for monitoring line-status conditions on the "S" lines so that each "S" line is controlled independently includes an analog section for delivering power independently to each of the "S" lines and for detecting line-status conditions on the "S" lines. The power controller also includes a microprocessor interface section for communicating with the microprocessor and for controlling the analog section. The analog section is formed of a plurality of output drivers for supplying individually the power to the plurality of "S" lines and line-status detector circuits for sensing line-status conditions on the "S" lines to provide a set of status logic signals for each "S" line. The microprocessor interface section includes an address register for storing a plurality of addresses corresponding to the line-status conditions to be monitored on the "S" lines. Decoder/multiplexers are provided for selecting a particular one of the line-status conditions in response to the addresses so that the same line-status condition for all "S" lines is readable simultaneously by the microprocessor. A data register receives control signals from the microprocessor upon reading of the line status conditions so as to switch off independently each of the output drivers to control power to the "S" lines.

4 Claims, 10 Drawing Sheets

QUAD EXCHANGE POWER CONTROLLER

BACKGROUND OF THE INVENTION

This invention relates generally to power regulation circuits, and more particularly, it relates to a quad exchange power controller for use in network terminating equipment, private branch exchanges (PBX) or central office line cards. In one particular application, the power controller of the present invention is used to supply a regulated −40 volts up to four separate lines at a S interface.

In CCITT (Consultative Committee for Telegraphy and Telephony) terminology, the S or subscriber lines interface is used to interconnect terminal equipment in an Integrated Servies Digital Network (ISDN) to one end of the network terminating equipment. The other end of the network terminating equipment is typically joined to a transmission line or U interface, which connects to a line terminator or central office line card. The quad exchange power controller of the present invention consists of a microprocessor interface section for communication with a microprocessor and an analog section having four output drivers for driving independently the S interface lines. This quad exchange power controller is manufactured and sold by Advanced Micro Devices, Inc., Sunnyvale, Calif. under part No. Am7938. The power controller is an integrated circuit formed of a single-chip package and is used to individually control and monitor via a microprocessor each of the four lines at the S interface. Specifically, the power to each "S" line may be switched off when the temperature reaches 140° C. and if the temperature continues to increase to 150° C., then all of the four lines at the S interface are disabled. Further, the line-status or load conditions consisting of low-level voltage, open-loop current, current overload, reverse current and thermal overload on each S interface line is monitored by comparing line current and voltage with a reference level.

SUMMARY OF THE INVENTION

In the preferred embodiment of the present invention, the quad exchange power controller for supplying separately a regulated power source to a plurality of "S" lines and for monitoring line-status conditions on the "S" lines so that each "S" line is controlled independently includes analog means for delivering power independently to each of the "S" lines and for detecting the line-status conditions on the "S" lines and microprocessor interface means for communicating with a microprocessor and for controlling the analog means. The analog means is formed of a plurality of output drivers for supplying individually the power to the plurality of "S" lines. The analog means also includes line-status detector means for sensing line-status conditions on the "S" lines to provide a set of status logic signals for each "S" line.

The microprocessor interface means is formed of microprocessor input logic means, address register means, data register means and status multiplexing means. The microprocessor input logic means has input terminals for receiving control signals from the microprocessor and has bidirectional terminals for transmitting data to the microprocessor and for receiving data from the microprocessor. The address register means is used to store a plurality of addresses, each of the addresses correspond to one of a plurality of line-status conditons to be monitored on the "S" lines. The data register means is responsive to the control signals from the microprocessor for switching off and on independently each of the output drivers to control power to the "S" lines. The status multiplexing means is responsive to the addresses for selecting a particular one of the line-status conditions so that the same line-status condition for all of the "S" lines are readable simultaneously by the microprocessor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
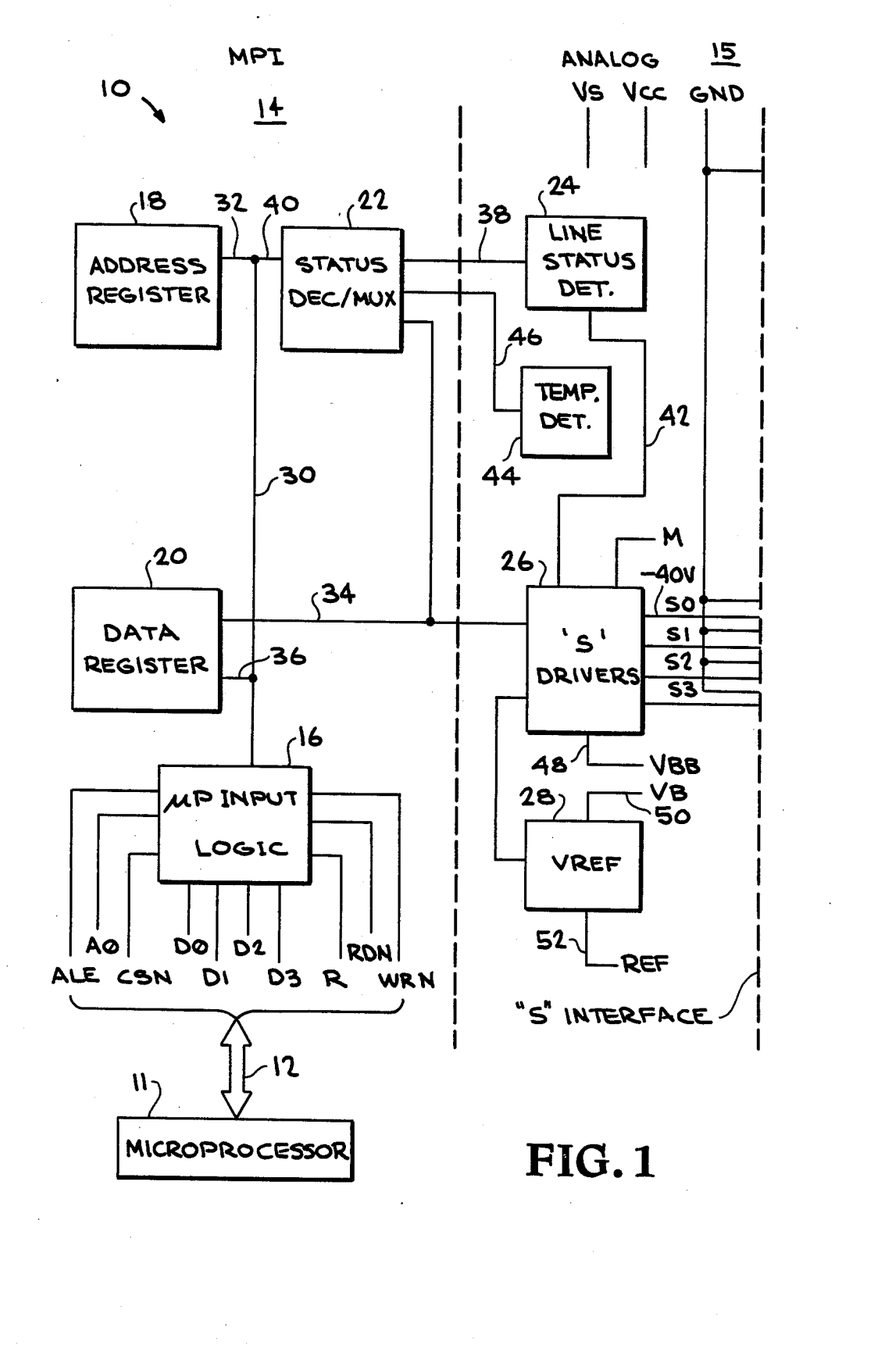
FIG. 1 is an overall functional block diagram of a quad exchange power controller of the present invention.

Referring now in detail to the drawings, there is shown in FIG. 1 an overall block diagram of a quad exchange power controller of the present invention designated generally by reference numeral 10. The power controller 10 supplies a regulated −40 volts power source via each of the four output or "S" lines S0, S1, S2 and S3 for the "S" interface in an Integrated Services Digital Netowrk (ISDN) as defined by the CCITT. Input power sources received by the power controller 10 may be from a local station battery or a centralized regulated power source. The power controller 10 communicates and is controlled by a microprocessor 11 via a microprocessor bus 12. The power controller 10 includes a microprocessor interface section 14 for communication with the microprocessor 11 and an analog section 15 which supplies the regulated −40 volts and detects status information of the four "S" lines S0 . . . S3. The microprocessor interface section 14 is formed of a microprocessor input logic portion 16, and address register portion 18, a data register portion 20, and a status decoder/multiplexer portion 22. The analog section 15 is formed of line-status detectors 24, "S" drivers 26, and a voltage reference network 28.

The microprocessor input logic portion 18 interfaces with the microprocessor 11 by the microprocessor bus 12 which includes six input signals A0, ALE, RDN, WRN, CSN, and R. In addition to these control signals, the logic portion 16 is provided with four bidirectional input/output data ports D0 . . . D3. the input control signal CSN is a chip select signal which enables the data register portion 20 upon an active low (CSN=0). The input control signal RDN is a read signal which allows the data stored in the address register portion 18 to be read by the microprocessor 11 via the data ports D0 . . . D3 upon an active low (RDN=0). The input control signal WRN is a write signal which allows the data from the microprocessor at the data ports D0 . . . D3 to be written into either the data register portion 20 or the address register portion 18. The input signal A0 is a lower address bit input signal. When the input signal A0 is high (A0=1), the data at the data ports D0 . . . D3 is written into the data register portion 20 upon activation of the write signal. When the input signal A0 is low (A0=0), the data at the data ports D0 . . . D2 is written into the data register portion 18 upon activation of the write signal. The input signal ALE is an address latch enable signal which permits the input signal A0 to be written into an internal latch-enable register upon an active high. In other words, when ALE=1 the input signal A0 is written into the internal line-enable register. The input signal R is a reset signal which resets the data register portion 20 so as to switch off the "S" drivers 26 in the analog section 15 upon power up. The terminals D0 . . . D3 are bidirectional data ports which provide communication between the power controller 10 and the microprocessor 11. In particular, the data ports D0 . . . D3 are use to transfer data from the microprocessor 11 to either the address register portion 18 or to the data register portion 20 in the power controller 10. Further, the data ports are also used to transfer the status information of the four "S" lines via the status detectors 24 and multiplexer 22 to the microprocessor 11.

The address register portion 18 is 4-bits wide and is accessible through the data ports D0 . . . D3 via lines 30 and 32. While the lines 30 and 32 are shown for simplification as a single line, they are understood to represent multiple conductor lines. The contents or addressed AI2 . . . AI0 of the three least significant bits (LSB) of the address register portion 18 determines the selection of the line-enable register and the status detectors 24. The content or address AI3 of the most significant bit (MSB) is accessed only during the read cycle. The code for the addresses AI2 . . . AI0 in order to access the line-enable register and the status detectors 24 is listed in TABLE I below:

TABLE I

| AI2 | AI1 | AI0 | SELECT |
|---|---|---|---|
| 0 | 0 | 0 | low-voltage buffer |
| 0 | 0 | 1 | open-loop current buffer |
| 0 | 1 | 0 | high current buffer |
| 0 | 1 | 1 | reverse current buffer |
| 1 | 1 | 0 | line-enable register |
| 1 | 1 | 1 | overload-temperature buffer |

For all other codes for the addresses AI2 . . . AI0, they are not valid or legal commands. For the MSB, a reading of address AI3=0 indicates a normal temperature and each driver is independently controlled. When the address AI3=1, this indicates a high temperature 150° C. and all drivers will be turned off.

The data register portion 20 is a 4-bits wide and controls the one or off condition of the "S" driver portion 26 via line 34. Data is written and read into the data register portion 20 through the microprocessor input logic via lines 30 and 36. The status multiplexer portion 22 delivers a four-bit status word relative to status information of the "S" lines via line 38. The status information is formed of a set of status logic signals consisting of a low-voltage signal, an open-loop current signal, a high current signal, a reverse current signal, and an overload-temperature signal. The same status for all four "S" lines is available in one word. In other words, the zero bit corresponds to the line S0, the first bit corresponds to the line S1, the second bit corresponds to the line S2, and the third bit corresponds to the line S3. The particular status information, ie, low voltage signal, is determined by the 4-bit addresses sent to the status multiplexer 22 via lines 32 and 40.

The above-discussed status information is obtained from the status detectors 24 which are connected to the "S" drivers 26 via line 42. The status detectors monitor the load conditions on eadh "S" line by comparing an electrical parameter such as the current and voltage at each "S" line with the reference level. The atatus detectors is comprised of a set of individual status buffers for each of the corresponding "S" lines. The measured parameter, reference level and corresponding function are listed in TABLE II, below;

TABLE II

| PARAMETER | REFERENCE LEVEL | FUNCTION |
|---|---|---|
| low-voltage | .9 × normal voltage | Detection of low voltage |
| low-current | 5 mA | Detection of open-loop current |
| high current | .9 × maximum current | Detection of overload current |
| reverse current | −5 mA | Detection of reverse current |
| overload-temperature | 140° C. and .9 × $I_{max}$ | Detection of overload condition at high temperature |

As can be seen, the status detectors 24 are connected to the multiplexer portion 22 via the line 38. The address codes for the status detectors 24 are shown above in TABLE I. In addition to the status detectors 24, an integrated temperature detector 44 is connected to the multiplexer portion 22 via line 46 for monitoring the temperature of the power controller and provide a corresponding logic signal when the temperature exceeds 150° C. Accordingly, the status information for each "S" line and the temperature detector measurement can be read by the microprocessor 11 via the lines 40, 30 and the microprocessor input logic portion 16.

The "S" drivers 26 consist of four output drivers, one for each of the "S" lines S0 . . . S3, for supplying the −40 volts. The input power to the "S" drivers is connected from a negative supply voltage VBB via line 48. Each of the four output drivers are switched off independently when a temperature of 140° C. is reached and high current condition exists on the particular "S" line. However, when the temperature reaches 150° C. all of the output drivers are unconditionally switched off.

The voltage reference network 28 generates an external reference supply VB, which is typically −43 volts, via line 50 and is connected to a ground potential via line 52 at REF. The voltage reference network 28 also provides an internal reference voltage of −5 volts to the status detectors 24.

Figure 2A:
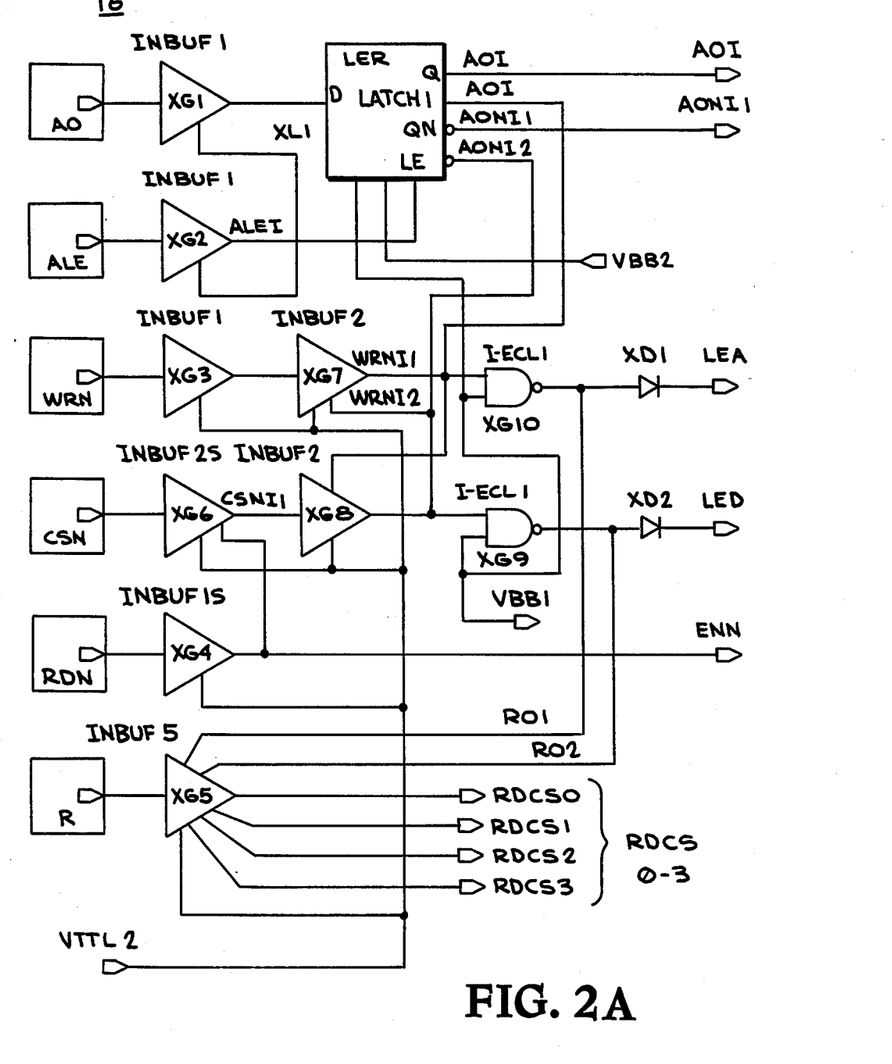
FIGS. 2(a), 2(b) and 2(c)-2(f), when connected together, show a more detailed block diagram of the power controller of FIG. 1.
Figure 2B:
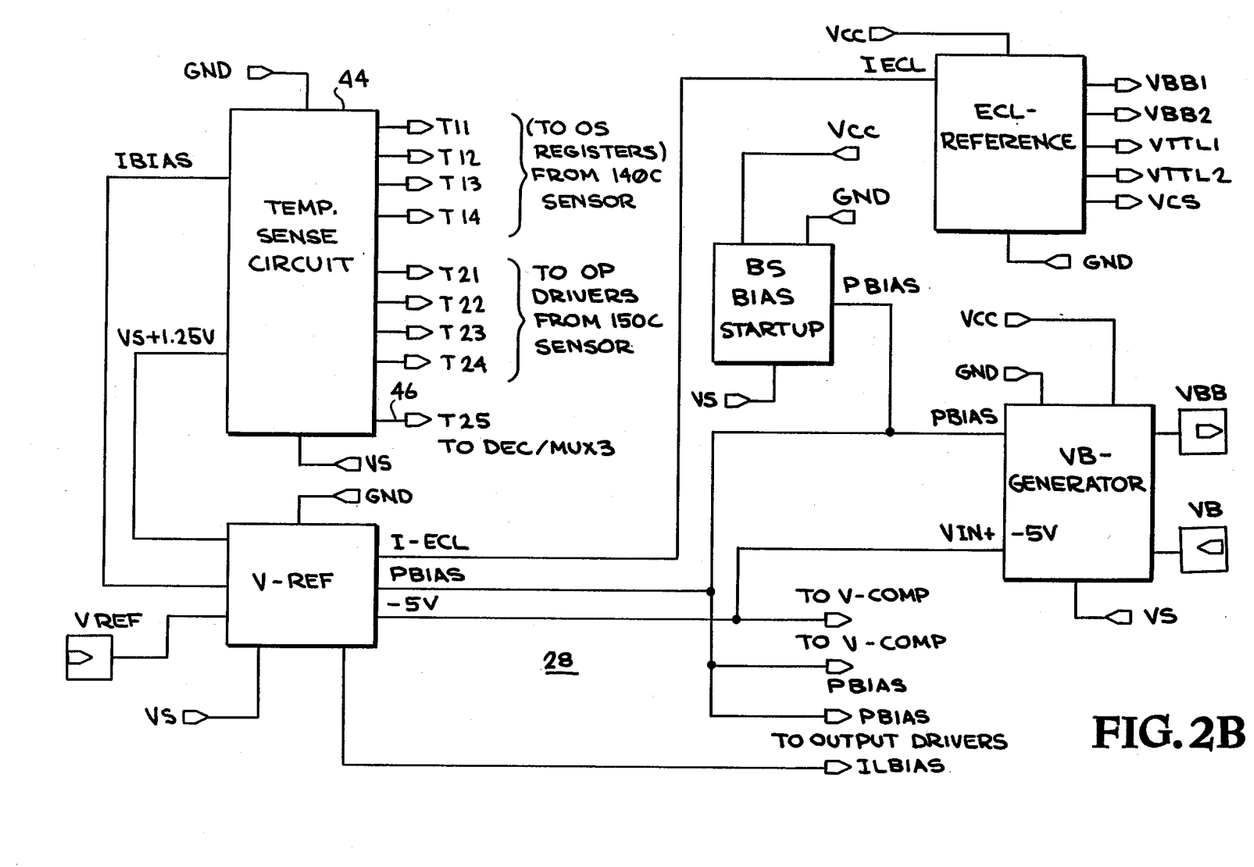
Figure 2C:
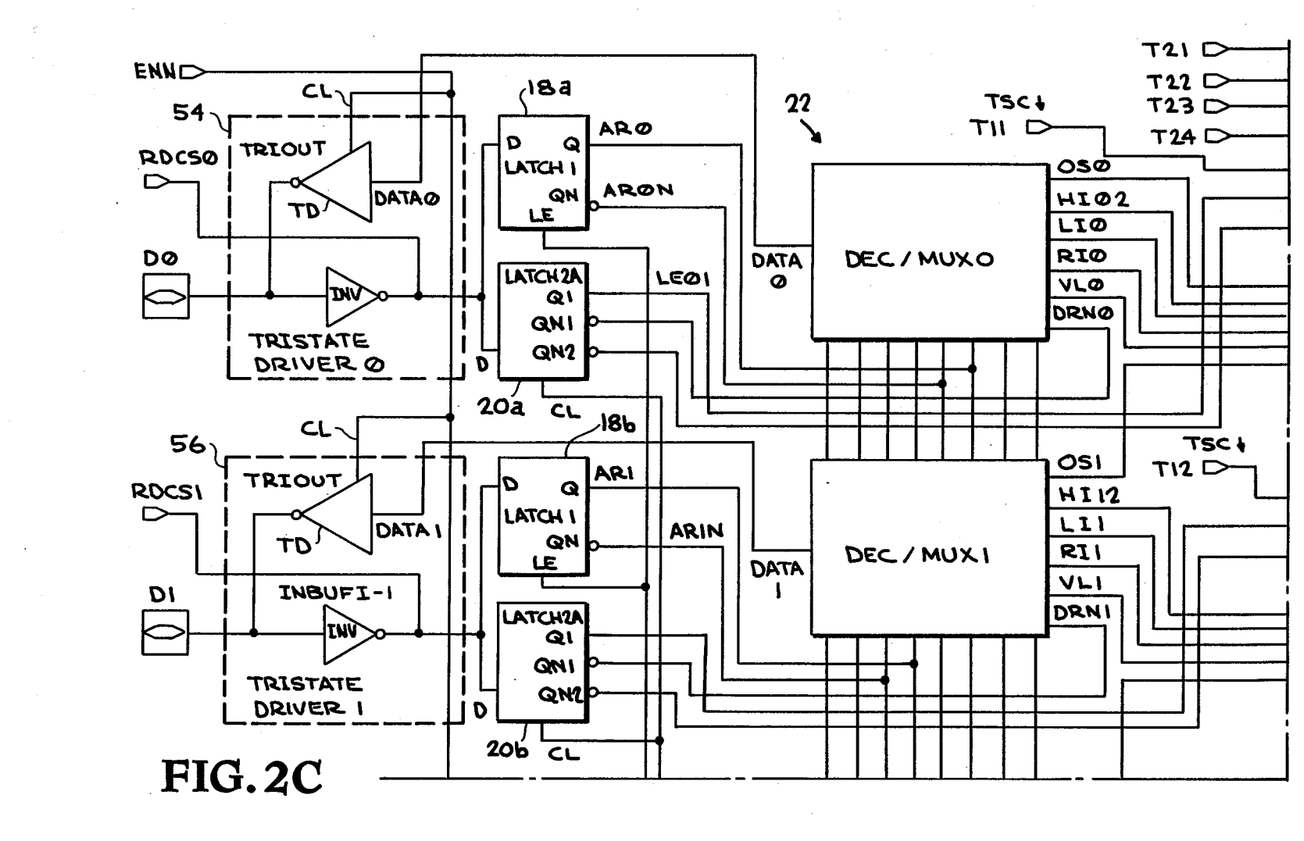
Figure 2D:
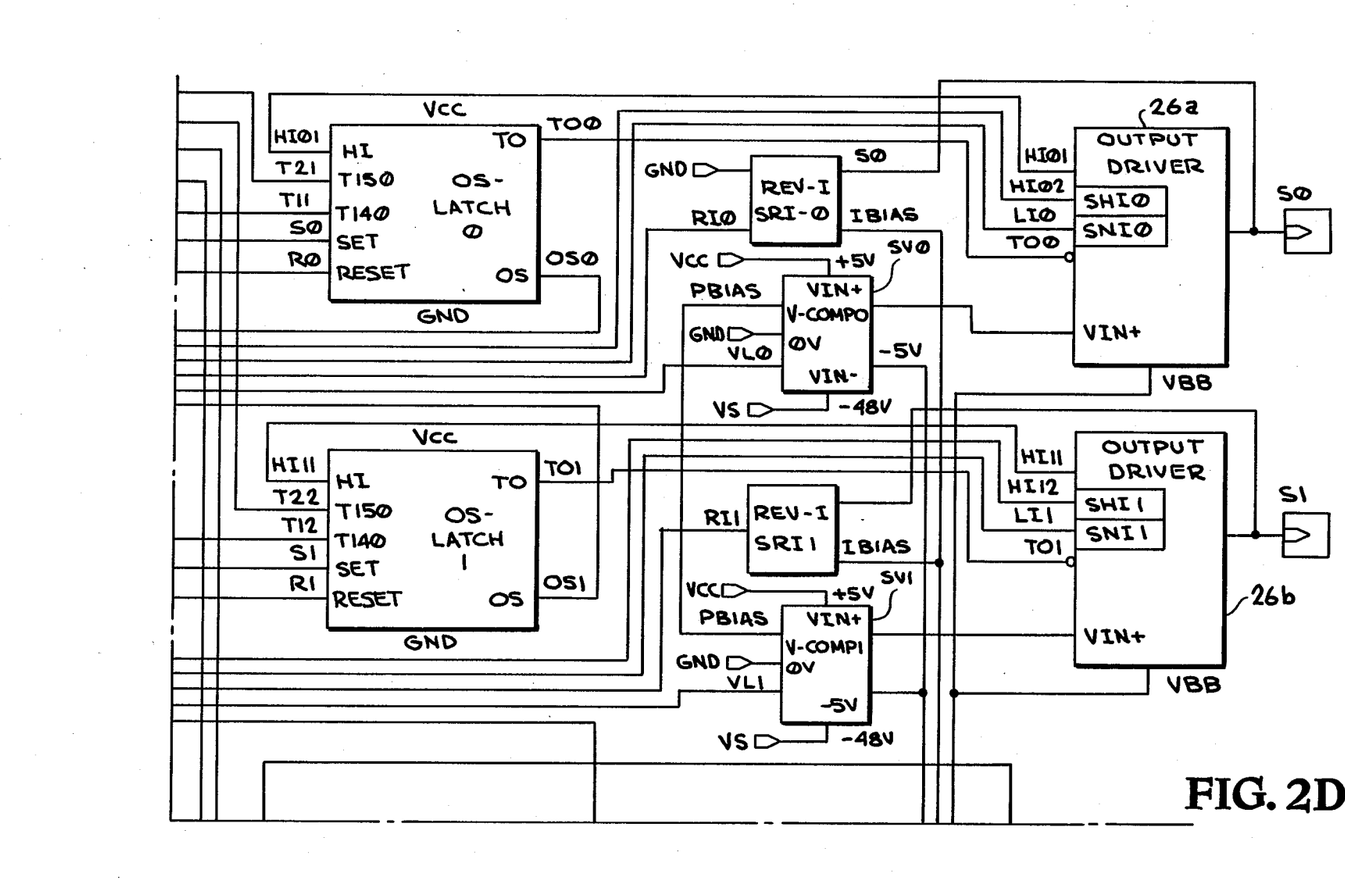
Figure 2E:
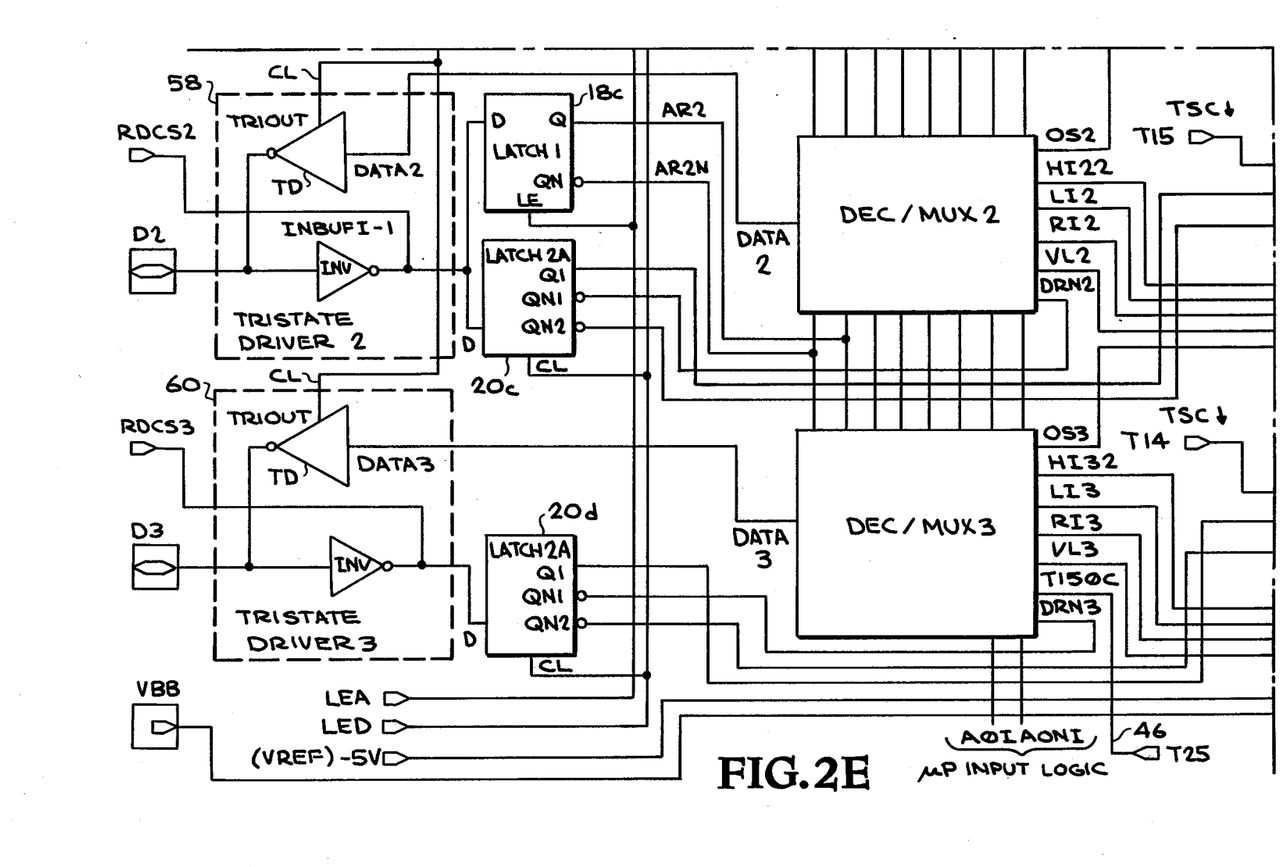
Figure 2F:
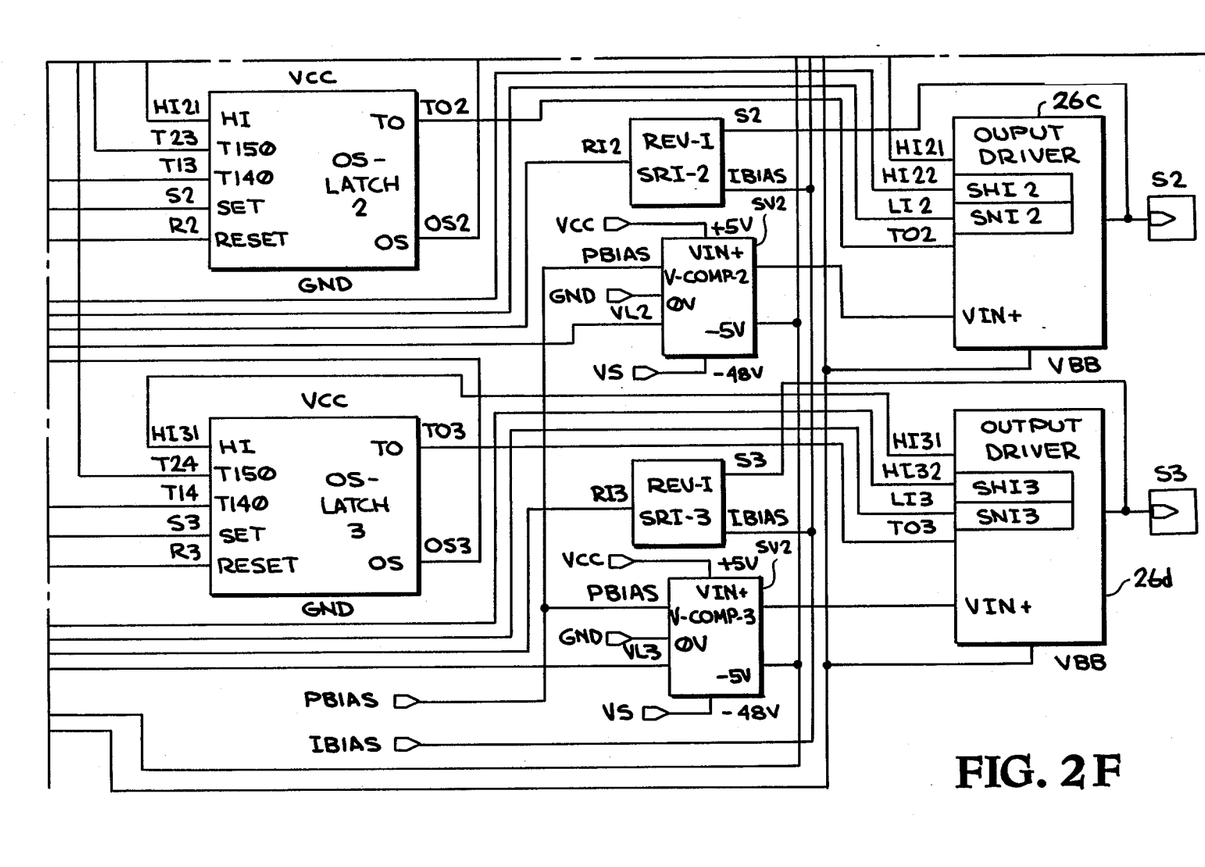

Referring now to FIGS. 2(a), 2(b) and 2(c), there is illustrated, when connected together, a more detailed block diagram of the power controller 10 of FIG. 1. In FIG. 2(a), there is shown in detail a part of the microprocessor input logic portion 16 which receives the six input control signals A0, ALE, WRN, CSN, RDN, and R. As can be seen, the microprocessor logic input portion 16 includes non-inverting buffers G1, G2 . . . G6 for receiving the respective input signals. The input portion 16 also includes buffers G7, G8, a line-enable register or latch LER and a pair of ECL NAND gates G9 and G10. The line-enable register has its D-input terminal connected to the output of the buffer G1 and its LE terminal connected to the output of the buffer G2. The Q and Qn outputs of the latch provides an internal lower address bit signal AOI and its complement AONI1, respectively. The buffer G7 has its input connected to the output of the buffer G3 and its output coupled to the input of the gate G10. The output of the gate G10 provides an internal address enable signal LEA for the address register portion 18 in FIG. 2(c). The buffer G8 has its input connected to the output of the buffer G6 and its output connected to the input of the gate G9. The output of the gate G9 provides an internal data enable signal LED for the data register portion 20 in FIG. 2(c). The output of the buffer G4 provides an internal tri-state enable signal ENN. The output of the buffer G5 provides six internal reset signals R01, R02, RDCS0, RDCS1, RDCS2 and RDCS3. The latter four reset signals RDCS0 . . . RDCS3 are used to reset the data register portion 20 upon start-up.

In FIG. 2(b), there is shown a more detailed block diagram of the temperature detector 44 and the voltage reference network 28 of FIG. 1. The temperature detector is comprised of a temperature sense circuit which provides output signals T11, T12, T13, and T14 corresponding to the four "S" lines and are connected to the T140 terminals for the respective overload latched on 0S0 . . . 0S3 depicted in FIG. 2(c). The temperature sense circuit also generates output temperature signals T21, T22, T23 and T24 which are connected to the T150 terminal in their respective latches 0S0 . . . 0S3. The voltage reference network 28 includes a supply reference voltage V-REF, a reference generator VB, a bias start-up circuit BS, and a current and voltage reference source ECL for generating the various bias currents, bias voltages and internal voltage sources which are required by the power controller 10.

In FIG. 2(c), it can be seen that the microprocessor input logic portion 16 further includes interface circuits 54, 56, 58 and 60. Each of the interface circuits is identical in construction and is formed of a tri-state driver TD and an inverter INV. The inputs to the tri-state drivers are from the respective data signals DATA0 . . . DATA3 from the DEC/MUX0 . . . DEC/MUX3. The outputs of each of the tri-state drivers TD is connected to the corresponding inputs of the inverters INV and to the data ports D0 . . . D3. The outputs of the inverters INV are connected to the respective D-inputs in the address register portion 18 and the data register portion 20. The tri-state control line CL of each driver TD is connected to the tri-state enable signal ENN from FIG. 2(a).

The address register portion 18 of FIG. 1 is formed of address latches 18a, 18b and 18c in FIG. 2(c). The data register portion 20 is formed of data latches 20a, 20b, 20c and 20d. The status decoder/multiplexer portion 22 includes DEC/MUX0 . . . DEC/MUX3. The "S" drivers 26 are formed of output drivers 26a, 26b, 26c and 26d which provide the respective output voltages on lines S0 . . . S3. Each of the output drivers is identical in construction and includes a high current buffer SHI and an open-loop current buffer SNI. The buffer SHI generates a status logic signal indicative of a current overload condition on the "S" line. When the current in a particular "S" line exceeds a threshold value of 90% of the maximum current available in such "S" lines, the logic signal corresponding to the current overload becomes activated to a high or "1" logic level. The buffer SNI generates a status logic signal indicative of an open-loop (no current) condition of the "S" line. When the current in a particular "S" line decreases below a threshold value of 5 mA, the status logic signal corresponding to the open-loop condition becomes activated to a high logic level. While the buffers SHI and SNI are formed inside each output driver, they are actually a part of the status detectors 24.

In addition to these status buffers SHI and SNI, the status detectors 24 for each "S" line further includes a low-voltage buffer SV, a reverse current buffer SRI and an overload-temperature buffer OS-LATCH. The buffer SV generates a status logic signal indicative of a low voltage condition on the "S" line. When the voltage on a particular "S" line decreases to a threshold of 10% below a preset voltage, the status logic signal corresponding to the low-voltage condition becomes activated to a high logic level. The buffer SRI generates a status logic signal indicative of a reverse-current on the "S" line. When a current in the reverse direction exceeds a threshold value of 5 mA, the status logic signal corresponding to the reverse-current condition is activated to a high logic level. The overload-temperature buffer OS-LATCH generates a status logic signal corresponding to a temperature of 140° C. When this temperature condition occurs, the status logic signal corresponding to the over-load temperature condition will be set to a logic "1" and the "S" line drivers which are in the overload condition will be switched off via output signals T0 . . . T3. When the temperature of the power controller 10 increases to 150° C., all of the overload-temperature buffers OS-LATCH generate status logic signals set to a logic "1" and all of the "S" drivers will be switched unconditionally off. Accordingly, the status detectors 24 for the power controller 10 in FIG. 1 for the four "S" lines are comprised of the buffers SV0 . . . SV3, SNI0 . . . SNI3, SHI0 . . . SHI3, SRI0 . . . SRI3 and OS/LATCH0 . . . OS/LATCH3.

The multiplexer DEC/MUX0 receives a first set of status logic signals corresponding to line-status conditons for the line S0. This first set consists of buffer signals HI02, LI0, RI0, VL0 and 0S0. The buffer signals HI02 and LI0 are from the status buffers SHI0 and SNI0 in the output driver 26a. The buffer signal RI0 is from the status buffer SRI0, and the buffer signal VL0 is from the status buffer SV0. The buffer signal 0S0 is from the latch 0S/LATCH0. Similarly, the multiplexers DEC/MUX1 . . . DEC/MUX3 receive respective second, third and fourth sets of status logic signals relative to the line-status conditions on the lines S1 . . . S3. These second through fourth sets of status logic signals are comprised of buffer signasl HI12 . . . HI32, LI1 . . . LI3, RI1 . . . RI3, VL1 . . . VL3 and 0S1 . . . 0S3.

The multiplexers DEC/MUX0 . . . DEC/MUX3 receive the internal lower bit addressing A0I and its complement A0NI from the microprocessor input logic portion 16 of FIG. 2(a). Further, the multiplexers DEC/MUX0 . . . DEC/MUX3 receive the address signal AR0 and its complement AR0N from the address register 18a, the address signal AR1 and its complement AR1N from the address register 18b, and the address signal AR2 and its complement AR2N from the address register 18c. The multiplexers DEC/MUX0 . . . DEC/MUX3 also receive respective data latch signals DRN0 . . . DRN3 from the data registers 20a . . . 20d. It will be noted that the multiplexer DEC/MUX3 also receives an input temperature signal on its terminal T150C via line 46 from the temperature sense circuit 44. The output data signals DATA0 . . . DATA3 from the respective multiplexers DEC/MUX0 . . . DEC/MUX3 are available at the data ports D0 . . . D3 via the tri-state drivers TD.

Figure 3A:
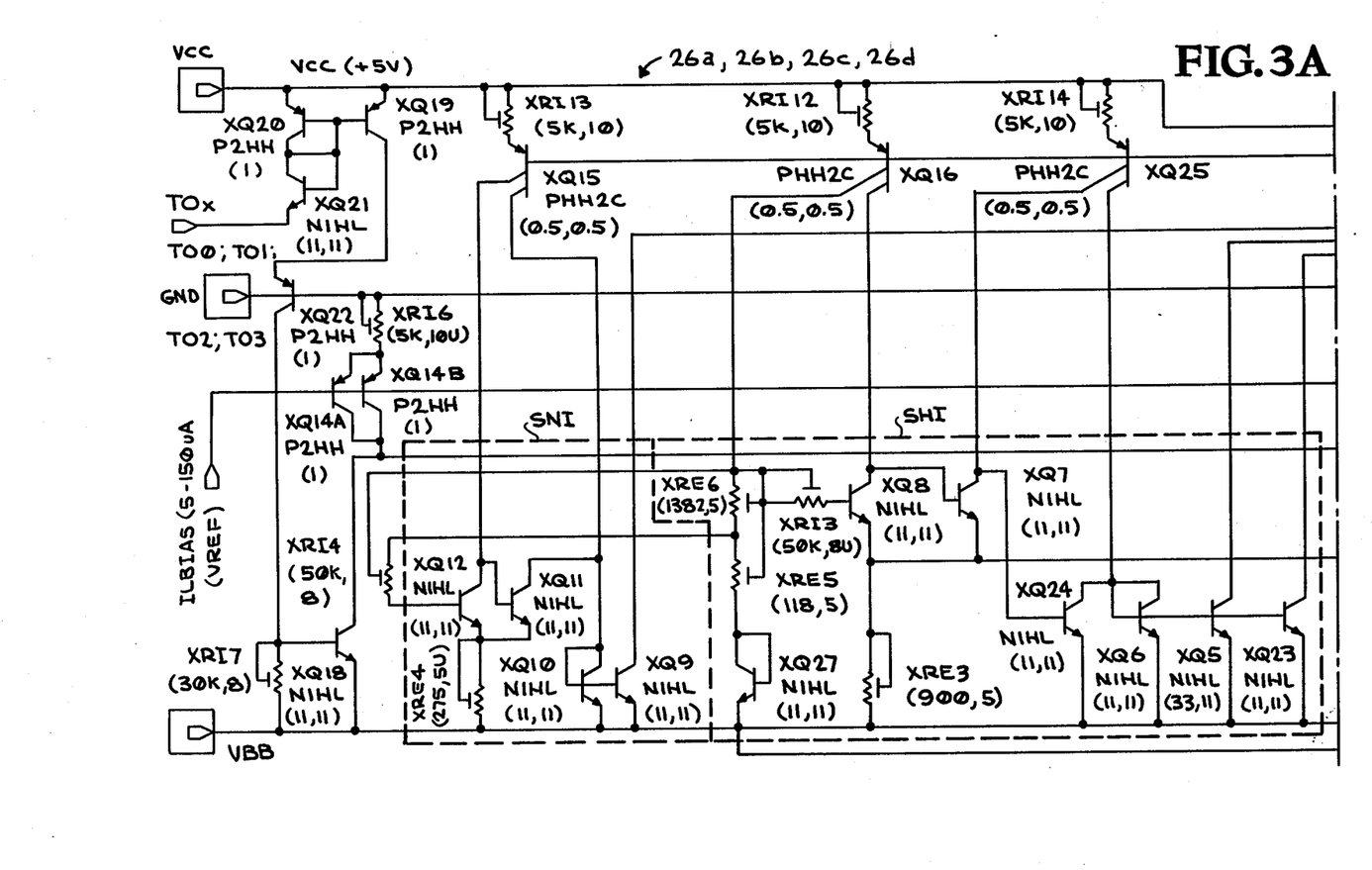
FIGS. 3(A)-3(B) are schematic circuit diagram of an output driver for use in the blocks 26a . . . 26d of FIG. 2(c)
Figure 3B:
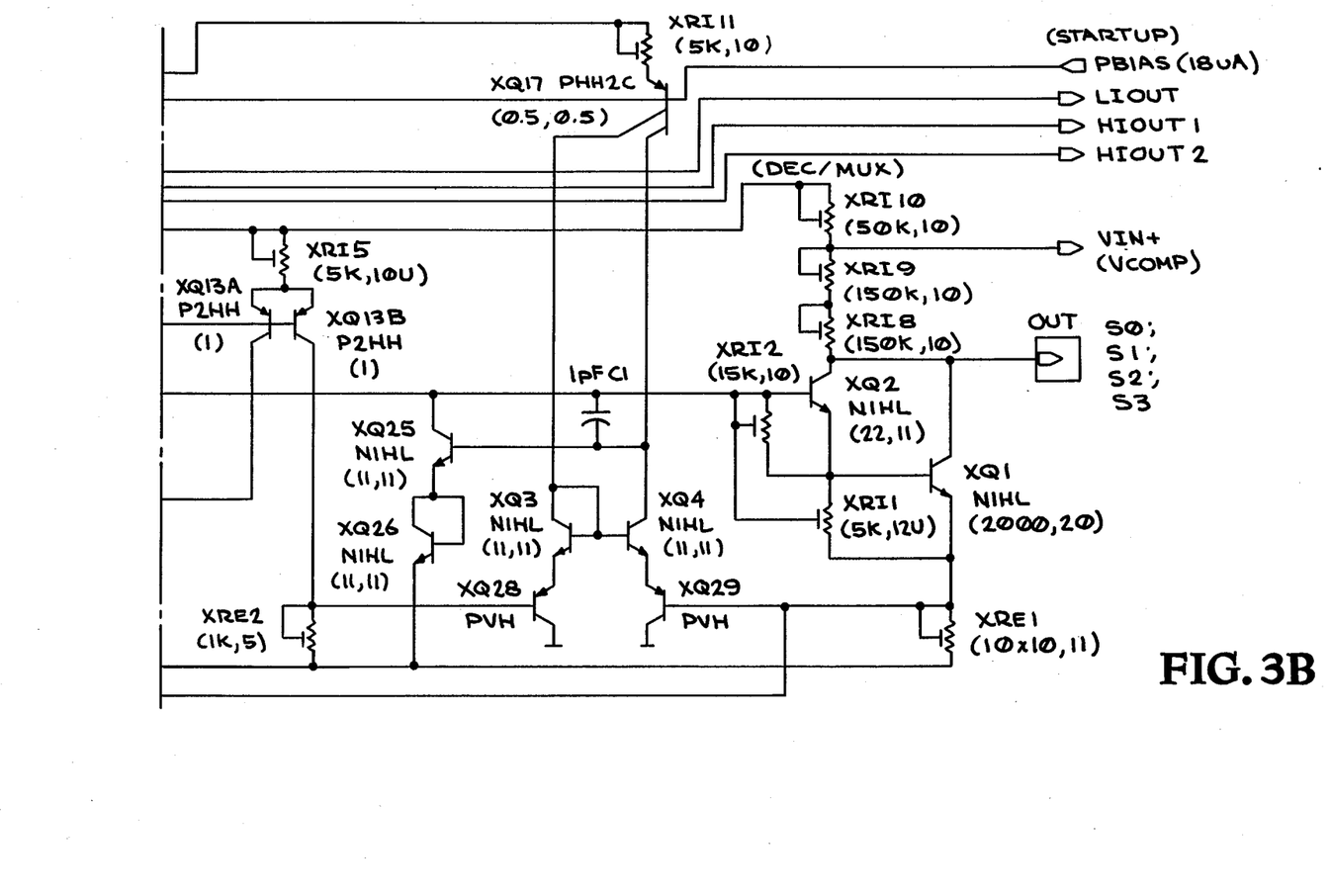

In FIG. 3, there is shown a detailed schematic circuit diagram of an output driver having buffers SHI and SNI for use in the blocks 26a . . . 26d of FIG. 2(c). The output driver includes a power output transistor Q1 whose collector is used to provide the output voltage at the "S" line. The buffer SHI is formed by current mirror transistors Q5 through Q8, Q23 and Q24. The status logic signal corresponding to high or overload current condition is taken from the collectors of the transistors Q5 and Q23. When 90% of the maximum current available is reached, the transistors Q5 and Q23 are turned on causing their collectors to sink current. The buffer SNI is formed by current mirror transistors Q9 through Q12. The status logic signal corresponding to the openloop current condition is taken from the collector of the transistor Q9. When the current decreases below 5 mA, then the transistor Q9 is turned off causing the collector to go to a high level.

The multiplexers DEC/MUX0 . . . DEC/MUX3 may be of a conventional construction which is capable of multiplexing the five input signals corresponding to line-status conditions in response to the addresses from the address register portion 18. However, a preferred embodiment of this type of decoder/multiplexer arrangement is described and illustrated in a co-pending application Ser. No. 908,478, filed on Sept. 17, 1986 which is assigned to the same assignee as this invention.

Figure 4:
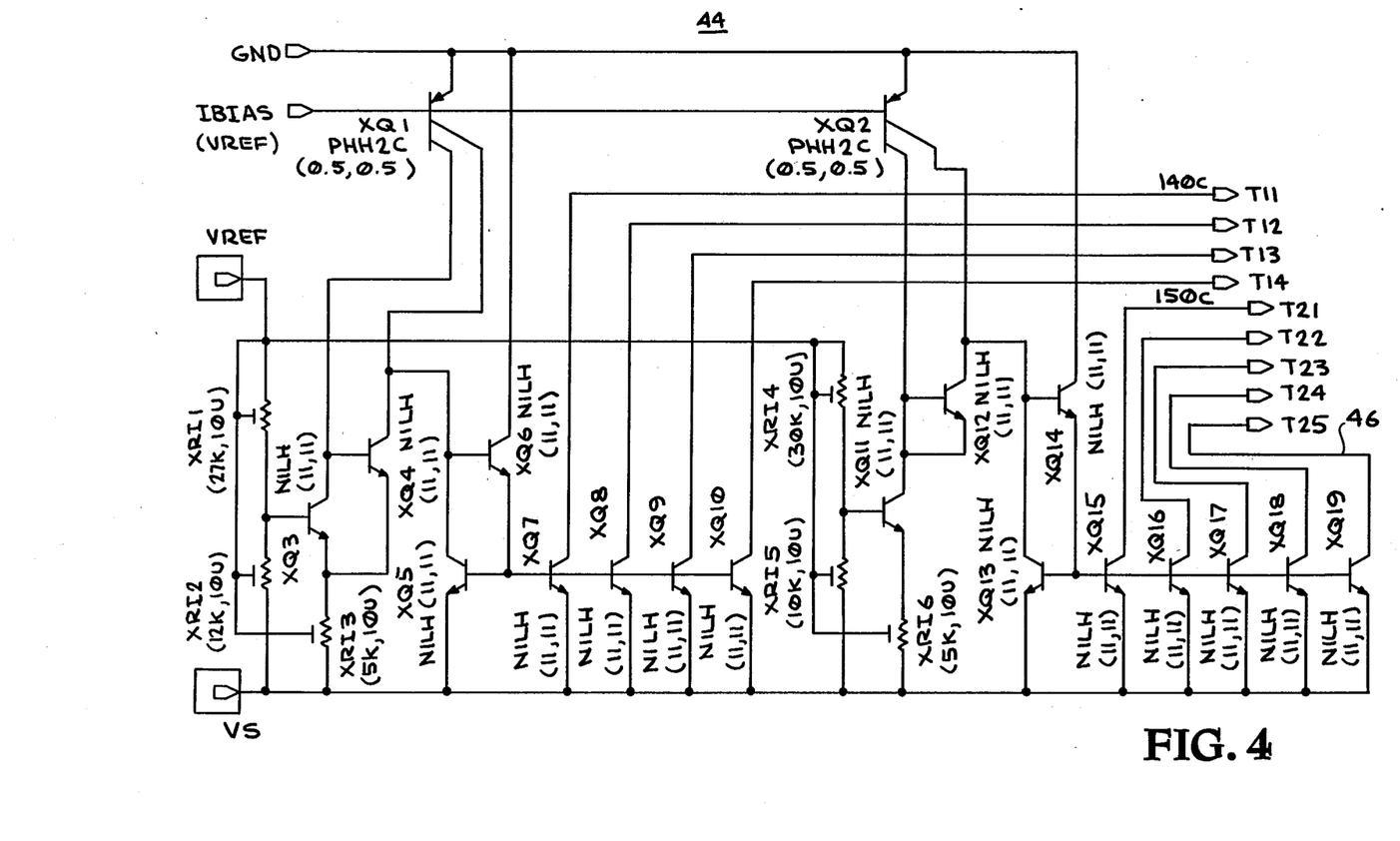
FIG. 4 is a schematic circuit diagram of a temperature sensing circuit for use in the block 44 of FIG. 2(b).

In FIG. 4, there is shown a detailed schematic circuit diagram of a temperature sense circuit for use in the block 44 of FIG. 2(b). As can be seen, the output temperature signals T11, T12, T13 and T14 are taken from the collectors of the transistors Q7 through Q10. Further, the output temperature signals T21, T22, T23, T24 and T25 are taken from the collectors of the transistors Q15 through Q19. This sense circuit 44 utilizes the temperature characteristic or the base-emitter voltage of the transistors for indicating when the temperatures of 140° C. and 150° C. are reached as is well known.

From the foregoing detailed description, it can thus been seen that the present invention provides a quad exchange power controller which includes a microprocessor interface section for communication with a microprocessor and an analog section having four output drivers for driving the S interface lines. Further, the power controller includes a plurality of status detectors for monitoring the line-status or load conditions consisting of open-loop current, low-level voltage, current overload, reverse current and thermal overload on each "S" interface line. A decocer/multiplexer circuit is provided for selecting a particular one of the line-status conditions so that the same line-status condition for all four "S" lines is readable simultaneously by the microprocessor.

While there has been illustrated and described what is at present considered to be a preferred embodiment of the present invention, it will be understood by those skilled in the art that various changes and modification may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A power controller for supplying separately a regulated power source to a plurality of "S" lines and for monitoring line-status conditions on the "S" lines so that each "S" line is controlled independently, said controller comprising:

analog means for delivering power independently to each of the "S" lines and for detecting the line-status conditions on the "S" lines, said analog means including:
  (a) a plurality of output drivers for supplying individually the power to said plurality of "S" lines, said plurality of output drivers being formed of a plurality of power transistors, each power transistor having its corresponding collector connected to one of said plurality of "S" lines;
  (b) line-status detector means for sensing line-status conditions on the "S" lines to provide a set of status logic signals for each "S" line, said line-status detector means including a plurality of status buffers for monitoring a low voltage condition, a no-current condition, a highcurrent condition, a reverse-current condition, and an overload-temperature condition on each "S" line so as to generate said set of status logic signals;

microprocessor interface means for communicating with a microprocessor and for controlling said analog means, said interface means including:
  (a) microprocessor input logic means having input terminals for receiving control signals from said microprocessor and having bi-directional ports for transmitting data to said microprocessor and for receiving data from said microprocessor;
  (b) address register means for storing a plurality of addresses, each address corresponding to one of the plurality of line-status conditions to be monitored on the "S" lines;
  (c) data register means formed of a plurality of latches in which each latch corresponds to one of said plurality of "S" lines and being responsive to the control signals for switching off and on independently each of the output transistors to control the power to the "S" line;
  (d) status decoder/multiplexing means responsive to said plurality of addresses for selecting a particular one of said line-status conditions so that the same line-status condition for all "S" lines is readable simultaneously by said microprocessor; and said status decoder/multiplexing means including a plurality of decoder/multiplexers, each decoder/multiplexer being connected to receive said set of status logic signals corresponding to one of said plurality of "S" lines, each of said decoders/multiplexers being further connected to receive said addresses from said address register means, each decoder/ multiplexer generating a data output signal corresponding to the same one of said line-status conditions to be monitored in said set of status logic signals for each corresponding "S" line, the particular line-status condition to be monitored being selected by said addresses of said address register means.

2. A power controller as claimed in claim 1 wherein said set of status logic signals include a low-voltage signal which is activated to a high logic level when the voltage on the "S" line decreases to 10% below a preselected voltage value, an open-loop current signal which is activated to a high logic level when the current on the "S" line decreases below a preselected current value, a high current signal which is activated when the current on the "S" line exceeds 90% of the maximum available current, a reverse-current signal which is activated to a high logic level when a current in the reverse direction exceeds a preselected current value, and an overload-temperature signal which is activated to a high logic level when the power controller reaches a preselected temperature level.

3. A power controller as claimed in claim 2, wherein said plurality of "S" lines comprise four "S" lines, and wherein said corresponding plurality of power transistors, line-status detector means, and decoder/multiplexing means each comprise four.

4. A power controller as claimed in claim 3, wherein said status buffer for monitoring the overload-temperature condition is formed of an overload latch for switching independently off each of said power amplifiers when a preselected high temperature condition is reached on that "S" line

* * * * *